(12) United States Patent
Kim et al.

(10) Patent No.: US 11,300,629 B2
(45) Date of Patent: Apr. 12, 2022

(54) CONTROL SYSTEM AND METHOD FOR DETECTING GROUND FAULT

(71) Applicant: SK INNOVATION CO., LTD., Seoul (KR)

(72) Inventors: Yong Uk Kim, Daejeon (KR); Dae Won Kwon, Daejeon (KR)

(73) Assignee: SK INNOVATION CO., LTD., Seoul (KR)

( * ) Notice: Subject to any disclaimer, the term of this patent is extended or adjusted under 35 U.S.C. 154(b) by 179 days.

(21) Appl. No.: 16/394,865

(22) Filed: Apr. 25, 2019

(65) Prior Publication Data

US 2019/0334343 A1    Oct. 31, 2019

(30) Foreign Application Priority Data

Apr. 26, 2018   (KR) .................. 10-2018-0048404

(51) Int. Cl.
| | |
|---|---|
| *G01R 31/396* | (2019.01) |
| *H02H 7/18* | (2006.01) |
| *H02H 7/22* | (2006.01) |
| *H02H 1/00* | (2006.01) |
| *G01R 31/52* | (2020.01) |
| *H01R 13/713* | (2006.01) |
| *H01M 10/42* | (2006.01) |
| *G01R 31/55* | (2020.01) |
| *G01R 31/56* | (2020.01) |
| *G01R 31/54* | (2020.01) |

(52) U.S. Cl.
CPC .......... *G01R 31/396* (2019.01); *G01R 31/52* (2020.01); *H02H 1/0007* (2013.01); *H02H 7/18* (2013.01); *H02H 7/22* (2013.01); *G01R 31/54* (2020.01); *G01R 31/55* (2020.01); *G01R 31/56* (2020.01); *H01M 2010/4271* (2013.01); *H01R 13/7132* (2013.01); *H01R 13/7135* (2013.01)

(58) Field of Classification Search
CPC .......... H02H 7/18; H02H 7/22; H02H 1/0007; G01R 31/50; G01R 31/52; G01R 31/54; G01R 31/55; G01R 31/56; H01M 2010/4271; H01R 13/7132; H01R 13/7135
USPC .......................................................... 361/42
See application file for complete search history.

(56) References Cited

U.S. PATENT DOCUMENTS

| | | | |
|---|---|---|---|
| 2012/0120530 A1* | 5/2012 | Yoon .................. | B60L 3/0069 361/42 |
| 2014/0079960 A1* | 3/2014 | Yun .................... | H01M 10/482 429/7 |
| 2016/0261127 A1* | 9/2016 | Worry ................ | H01M 10/425 |
| 2018/0086227 A1* | 3/2018 | Healy ................. | B60L 1/02 |

FOREIGN PATENT DOCUMENTS

| | | |
|---|---|---|
| CN | 104192018 A * | 12/2014 |
| KR | 10-1318265 | 10/2013 |

* cited by examiner

*Primary Examiner* — Scott Bauer
*Assistant Examiner* — Sreeya Sreevatsa
(74) *Attorney, Agent, or Firm* — IP & T Group LLP

(57) ABSTRACT

A rack BMS detects a ground fault through a circuit embedded therein, and as a master BMS is configured to disconnect all the connections between battery racks and a grid in the case in which the rack BMS detects the ground fault, no more current flows through chassis, thereby protecting the battery racks and ensuring safety of a person using the battery racks.

8 Claims, 6 Drawing Sheets

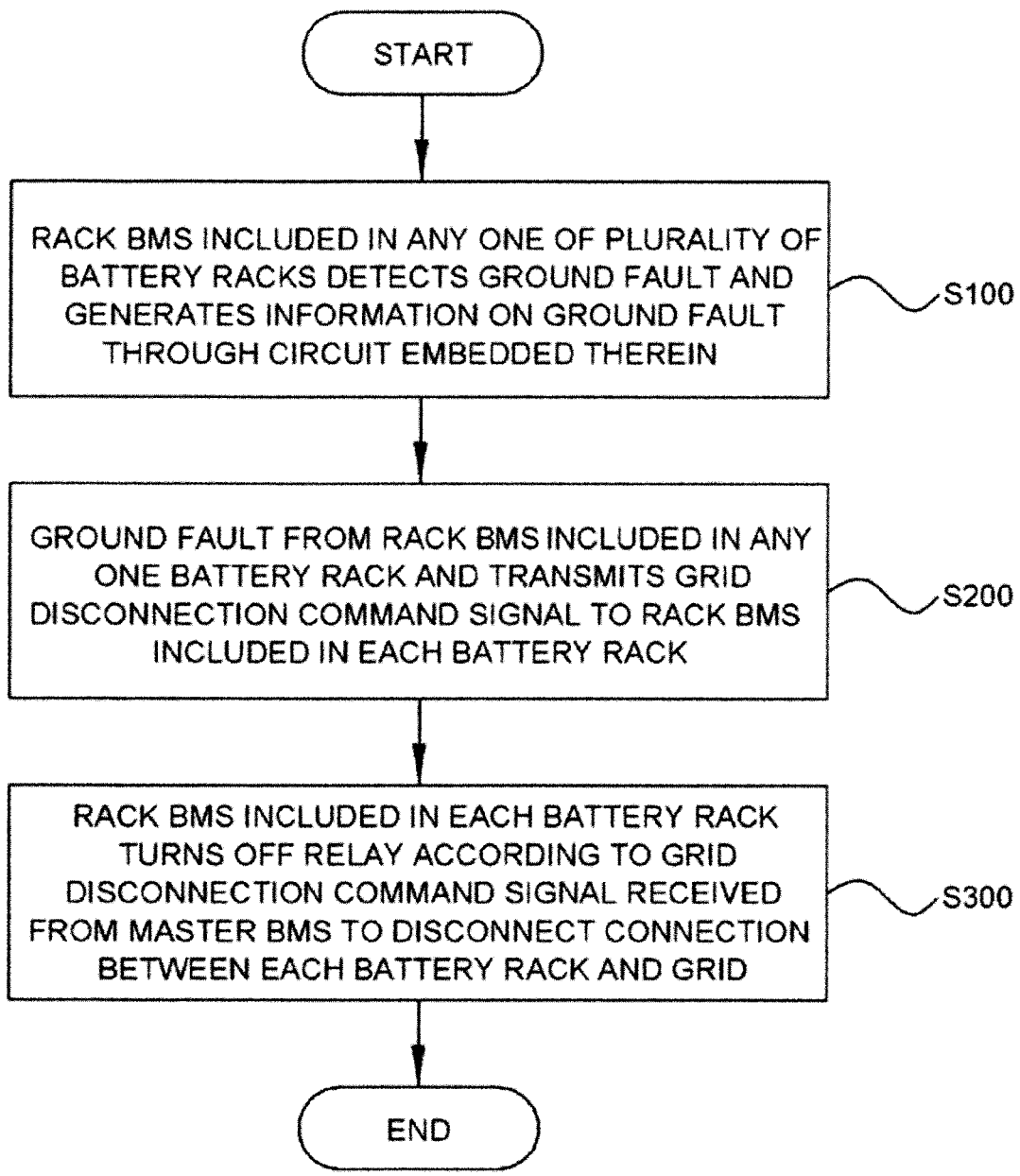

CONTROL SYSTEM AND METHOD FOR DETECTING GROUND FAULT

CROSS-REFERENCE TO RELATED APPLICATIONS

This application claims priority under 35 U.S.C. § 119 to Korean Patent Application No. 10-2018-0048404, filed on Apr. 26, 2018, in the Korean Intellectual Property Office, the disclosure of which is incorporated herein by reference in its entirety.

TECHNICAL FIELD

The following disclosure relates to a control system and method for detecting a ground fault in a battery rack operating system of an energy storage system (ESS).

BACKGROUND

In general, an energy storage system refers to a system that stores power which is excessively generated by a power plant and then supplies the power to meet demand patterns. More specifically, the energy storage system is configured to store the power generated by the power plant in a large energy storage means such as a battery rack without directly supplying the power to a home or a factory, and then supply the power to the home or the factory when the power supply is needed.

The energy storage system is a key technology that is essential for building a Smart Grid that has been emerging recently. Smart Grid refers to an intelligent power grid that optimizes energy efficiency combining information technology with an existing unidirectional power grid having stages of power generation, transmission, and sales, and exchanging real-time information between power suppliers and consumers in both directions.

The energy storage system includes a battery rack operating system including a plurality of battery racks and a battery management system (BMS), a power conversion system (PCS), and an energy management system. Here, the plurality of battery racks are for charging and storing energy and discharging and outputting the energy when necessary, and the battery management system is for managing the plurality of battery racks.

The battery rack operating system includes a plurality of battery racks connected in parallel to a grid through relays, wherein each of the plurality of battery racks includes a plurality of battery trays and each of the battery trays includes a plurality of battery cells. In addition, in the battery rack operating system, a tray BMS is provided to each battery tray to manage the plurality f battery cells, a rack BMS is provided to each battery rack to manage the battery rack, and master BMS manages the plurality of battery racks.

In addition, chassis are disposed outside the battery tray of the battery rack and the rack BMS, and the battery racks are grounded through a cable connected to the chassis. Charging and discharging are performed in the plurality of battery cells included in the battery rack, and in this case, since the battery cells are insulated from the chassis, current does not flow to the chassis under normal circumstances. However, when the battery rack is exposed to a specific situation, such as a moisture leak in the battery rack, insulation resistance between the battery cells and the chassis (rack frame) becomes very small and a large amount of current flows through the chassis, and as a result, the battery rack may cause a fire due to arc discharge and a person is exposed to a risk of electric shock.

Further, as described above, the plurality of battery racks are connected in parallel to the grid through the relays, and in the battery rack operating system, the chassis may be disposed around the grid and when a specific situation is formed, the insulation resistance between the chassis and the grid becomes very small and a large amount of current flows through the chassis.

As described above, a phenomenon that the current flows through the chassis in the battery rack operating system is referred to as a ground fault, and a provision of a control system and method for such ground fault detection (GFD) is a very important issue in terms of protecting the battery racks and ensuring the safety of the person using the battery racks.

RELATED ART DOCUMENT

Patent Document (Patent Document 1) Korean Patent Publication No. 1318265 (2013 Oct. 8)

SUMMARY

An embodiment of the present invention is directed to providing a control system and method capable of protecting battery racks and ensuring safety of a person using the battery racks in detecting various ground faults.

Another embodiment of present invention is directed to providing a control system and method capable of improving accuracy and stability of ground fault detection.

In one general aspect, a control system for detecting a ground fault includes: a rack battery management system (BMS) included in each of a plurality of battery racks which are connected in parallel to a grid through a relay, and embedded with a circuit for detecting the ground fault and generating information on the ground fault; and a master BMS that generates a grid disconnection command signal by receiving the information on the ground fault from the rack BMS and transmits the grid disconnection command signal to the rack BMS included in each battery rack, wherein the rack BMS included in each battery rack turns off the relay according to the grid disconnection command signal received from the master BMS to disconnect a connection between each battery rack and the grid.

The information on the ground fault may be set to be generated in the rack BMS included in any one of the plurality of battery racks.

When the rack BMS included in any one battery rack does not generate the information on the ground fault, an information generation disable signal may be transmitted to the master BMS, and when the master BMS receives the information generation disable signal, a ground fault detection command signal for detecting the ground fault may be transmitted to the rack BMS included in the battery rack other than any one battery rack according to a predetermined algorithm.

When the master BMS transmits a forced dropping command signal to the rack BMS included in any one battery rack and any one battery rack is forcibly dropped from the grid, a ground fault detection command signal for detecting the ground fault may be transmitted to the rack BMS included in the battery rack other than any one battery rack according to a predetermined algorithm.

The circuit may be embedded in a micro controller unit (MCU) separate from a main MCU of the rack BMS, and a voltage and current measurement MCU of the battery rack.

In another general aspect, a control method for detecting a ground fault includes: a rack battery management system (BMS) included in any one of a plurality of battery racks which are connected in parallel to a grid through a relay detecting the ground fault and generating information on the ground fault through a circuit embedded in the rack BMS; a master BMS generating a grid disconnection command signal by receiving the information on the ground fault from the rack BMS included in any one battery rack and transmitting the grid disconnection command signal to the rack BMS included in each battery rack; and the rack BMS included in each battery rack turning off the relay according to the grid disconnection command signal received from the master BMS to disconnect a connection between each battery rack and the grid.

When the rack BMS included in any one battery rack does not generate the information on the ground fault, an information generation disable signal may be transmitted to the master BMS, and when the master BMS receives the information generation disable signal, a ground fault detection command signal for detecting the ground fault may be transmitted to the rack BMS included in the battery rack other than any one battery rack according to a predetermined algorithm.

When the master BMS transmits a forced dropping command signal to the rack BMS included in any one battery rack and any one battery rack is forcibly dropped from the grid, a ground fault detection command signal for detecting the ground fault may be transmitted to the rack BMS included in the battery rack other than any one battery rack according to a predetermined algorithm.

The circuit may be embedded in a micro controller unit (MCU) separate from a main MCU of the rack BMS, and a voltage and current measurement MCU of the battery rack.

BRIEF DESCRIPTION OF THE DRAWINGS

FIG. 6 is a flowchart of a control method for detecting a ground fault according to the present invention.

DETAILED DESCRIPTION OF EMBODIMENTS

Hereinafter, a control system and method for detecting a ground fault according to the present invention will be described in detail with reference to the accompanying drawings. The accompanying drawings are provided by way of example in order to sufficiently transfer the spirit of the present invention to those skilled in the art, and the present invention is not limited to the accompanying drawings provided below, but may be implemented in other forms.

Figure 1:
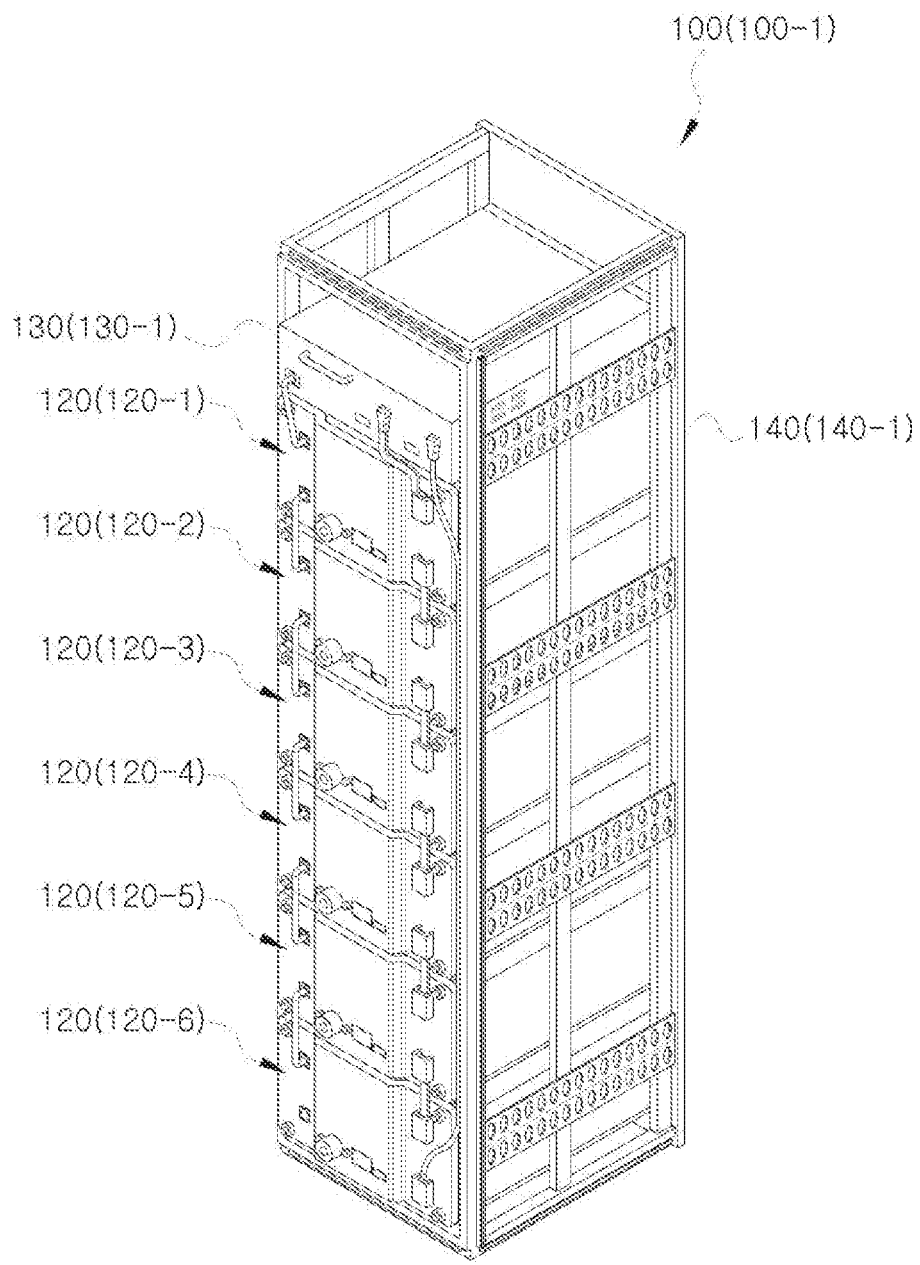
FIG. 1 is a view illustrating battery racks used in a control system for detecting a ground fault according to the present invention.
Figure 2:
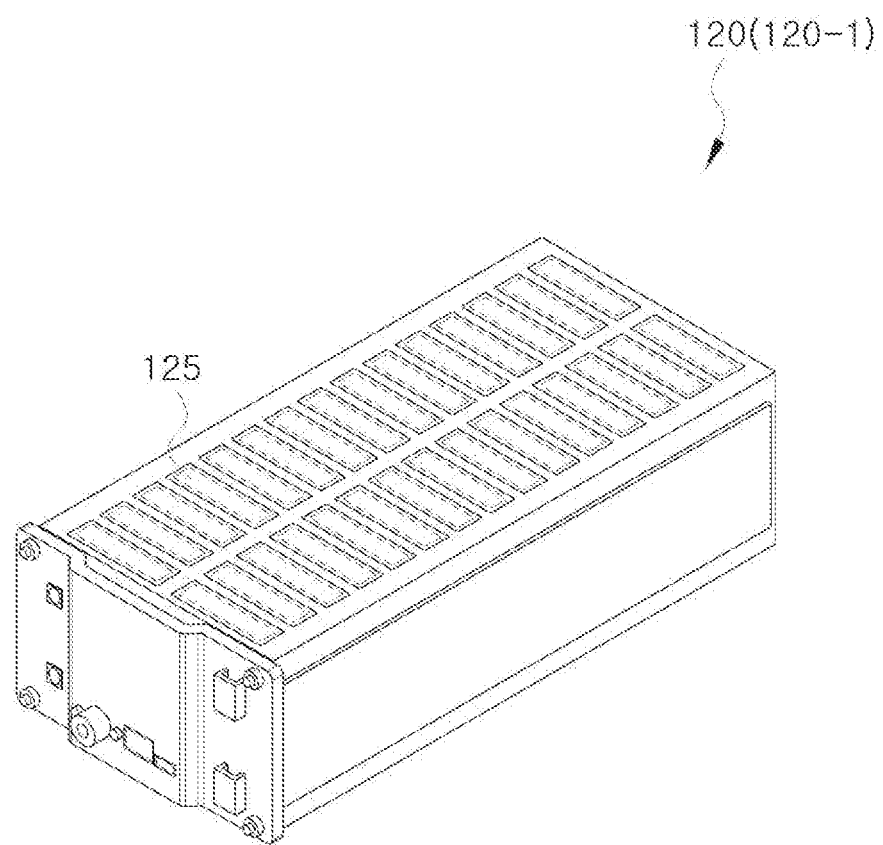
FIG. 2 is a view illustrating a battery tray included in the battery rack shown in FIG. 1.
Figure 3:
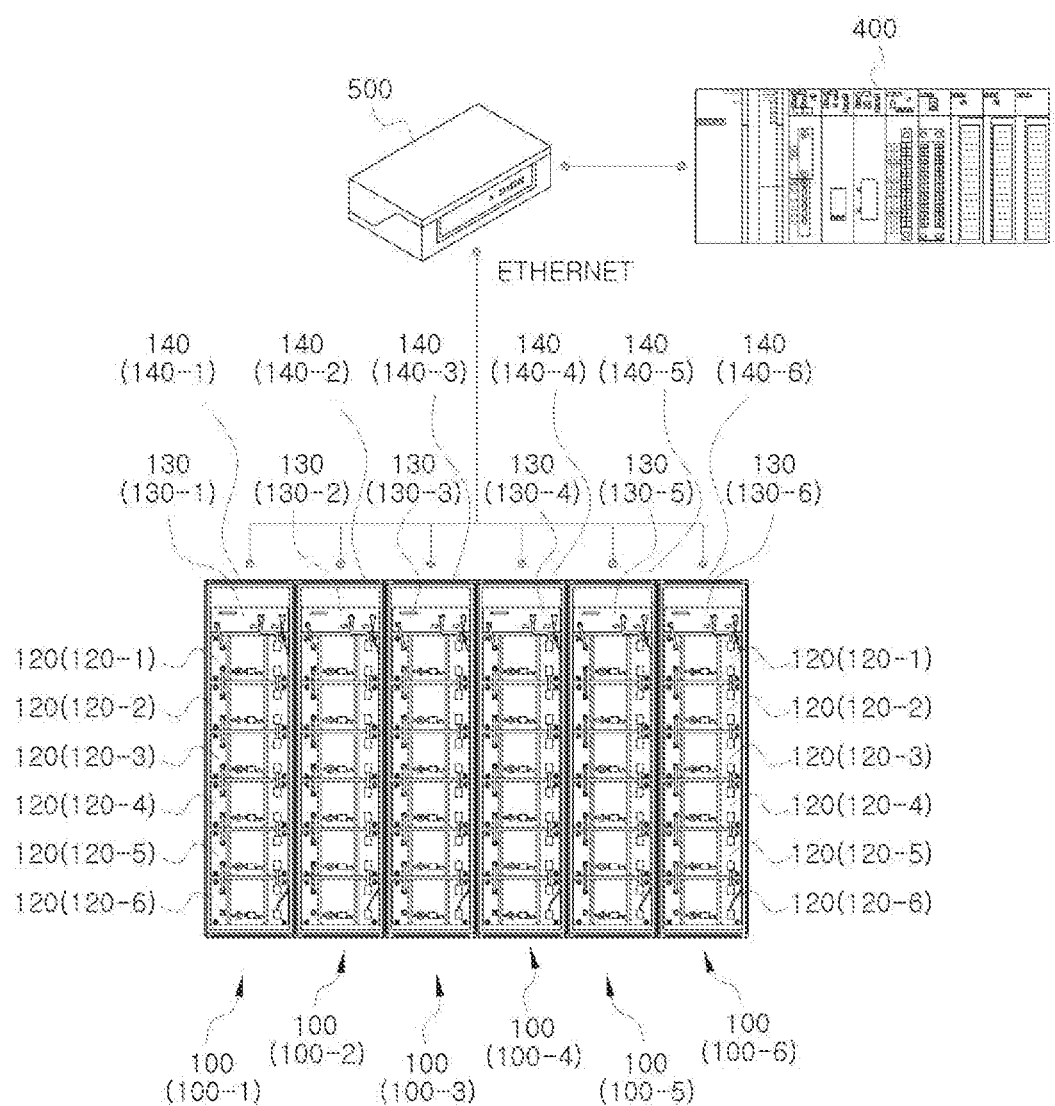
FIG. 3 is a view illustrating a control system for detecting a ground fault according to the present invention.

FIG. 1 is a view illustrating battery racks used in a control system for detecting a ground fault according to the present invention and FIG. 2 is a view illustrating a battery tray included in the battery rack shown in FIG. 1. FIG. 3 is a view illustrating a control system for detecting a ground fault according to the present invention, FIG. 4 is a diagram for describing the form in which the control system for detecting a ground fault according to the present invention is operated, and FIG. 5 is a schematic view of a micro controller unit (MCU) embedded in a rack BMS.

Referring to FIGS. 1 to 5, in a control system for detecting a ground fault according to the present invention, a plurality of battery racks 100 (100-1, 100-2, 100-3, 100-4, 100-5, and 100-6) are connected in parallel to a grid 200 through relays 300, each of the battery racks 100 (100-1, 100-2, 100-3, 100-4, 100-5, and 100-6) includes a plurality of battery trays 120 (120-1, 120-2, 120-3, 120-4, and 120-5), and each of the battery trays 120 (120-1, 120-2, 120-3, 120-4, and 120-5) includes a plurality of battery cells 125.

Figure 4:
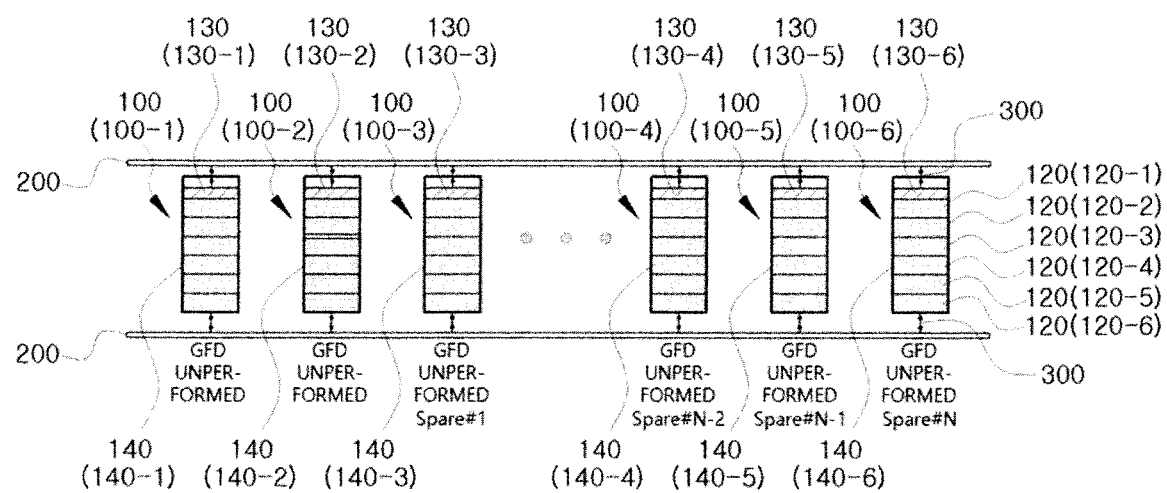
FIG. 4 is a diagram for describing the form in which the control system for detecting a ground fault according to the present invention is operated.
Figure 5:
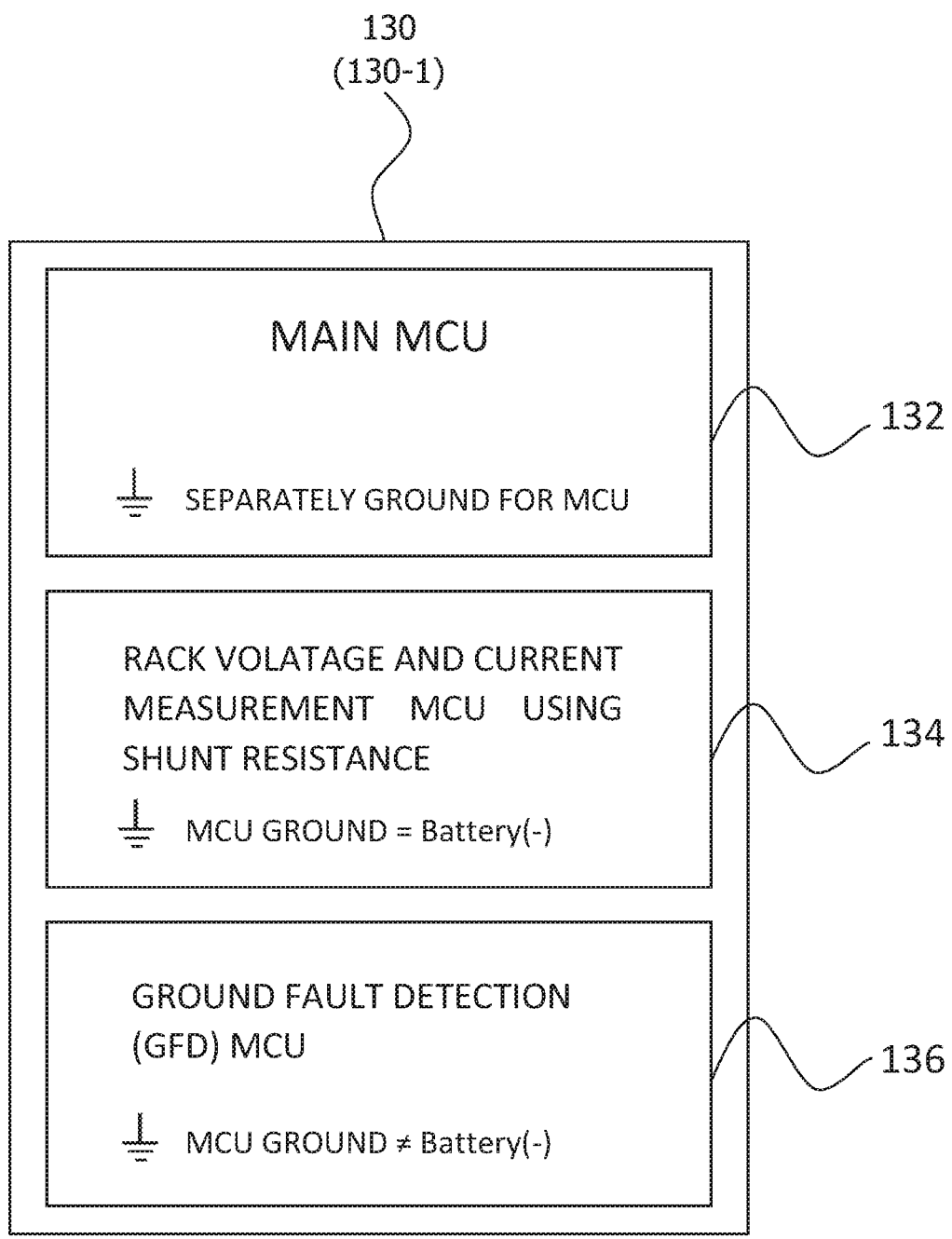
FIG. 5 is a schematic view of a micro controller unit (MCU) embedded in a rack BMS.

In addition, chassis 140 (140-1, 140-2, 140-3, 140-4, 140-5, and 140-6) are disposed outside the battery trays 120 (120-1, 120-2, 120-3, 120-4, and 120-5) and rack BMSs 130 (130-1, 130-2, 130-3, 130-4, 130-5, and 130-6), and a chassis (not shown) may also be disposed around the grid 200 illustrated in FIG. 4.

The control system for detecting the ground fault according to the present invention includes a rack BMS 130 and a master BMS 400.

Each of the rack BMSs 130 (130-1, 130-2, 130-3, 130-4, 130-5, and 130-6) is provided in each of the plurality of battery racks 100 (100-1, 100-2, 100-3, 100-4, 100-5, and 100-6), and is embedded with a circuit for detecting the ground fault and generating information on the ground fault.

Referring to FIG. 5, the rack BMS 130 includes a main MCU 132, a rack voltage and current measurement MCU 134, and a ground fault detection MCU 136.

Here, the main MCU 132 serves to manage the rack voltage and current measurement MCU 134 and the ground fault detection MCU 136, transmit a variety of information received from the rack voltage and current measurement MCU 134 and the ground fault detection MCU 136 to the master BMS 400, and control the relay 300 through information received from the master BMS 400. The rack voltage and current measurement MCU 134 measure a voltage and current of the plurality of battery cells 125. In addition, the ground fault detection MCU 136 detects a ground fault, generates information on the ground fault, and outputs the information on the ground fault to the master BMS 400 through the circuit embedded therein.

The reason why the circuit for detecting the ground fault and generating the information on the ground fault is embedded in the ground fault detection MCU 136 without being embedded in the main MCU 132 or the rack voltage and current measurement MCU 134 is that the circuit may be controlled by an independent control unit when being embedded in an MCU separate from the main MCU 132 or the rack voltage and current measurement MCU 134, thereby making it possible to improve detection speed and accuracy of the ground fault.

Although a total of six rack BMSs 130 are illustrated in FIGS. 3 and 4, the number of rack BMSs 130 in the battery rack operating system may be variously provided in the range of several to several tens. In this case, if all rack BMSs 130 are capable of performing the function of detecting the ground fault, a phenomenon may occur in which the current flowing through the chassis (i.e., leakage current) increases, and when the leakage current increases, the master BMS 400 recognizes that a ground fault has occurred although the ground fault has not actually occurred.

Accordingly, in order to allow the master BMS 400 to accurately recognize the occurrence situation of ground fault and to further improve efficiency of the system according to the present invention, it is preferable to set the detection of the ground fault and the generation of the information on the ground fault so as to be performed only in the rack BMS 130-2 included in any one (e.g., 100-2 in FIG. 4) of the plurality of battery racks 100. To this end, it is possible to give the rack BMS 130-2 itself a setting for detecting the ground fault, and it is not possible to give such a setting other rack BMSs 130-1, 130-3, 130-4, 130-5, and 130-6. Alternatively, the control system may be implemented in the form in which a ground fault detection command signal for causing the master BMS 400 to detect the ground fault is transmitted only to the rack BMS 130-2 and is not transmitted to other rack BMSs 130-1, 130-3, 130-4, 130-5, and 130-6.

If the current flows through the chassis 140-5 of any one (e.g., 100-5 in FIG. 4) of the plurality of battery racks 100 or the current flows through the chassis (not shown) provided around the grid 200, the rack BMS 130-2 which is connected to the grid 200 in parallel with the rack BMS 130-5 may detect such a flow of current as the ground fault and generate the information on the ground fault through the circuit embedded therein. The master BMS 400 is communicatively connected to the rack BMS 130 using a communication device, such as a switching hub, and accordingly, the information on the ground fault generated by the rack BMS 130-2 may be input to the master BMS 400.

When the master BMS 400 receives the information on the ground fault from the rack BMS 130-2, the master BMS 400 generates a grid disconnection command signal and transmits the grid disconnection command signal to the rack BMSs 130-1, 130-2, 130-3, 130-4, 130-5, and 130-6 included in the battery racks 100-1, 100-2, 100-3, 100-4, 100-5, and 100-6.

Thereafter, when the rack BMSs 130-1, 130-2, 130-3, 130-4, 130-5, and 130-6 included in the battery racks 100-1, 100-2, 100-3, 100-4, 100-5, and 100-6 receive the grid disconnection command signal from the master BMS 400, the relay 300 is turned off according to the grid disconnection command signal to disconnect a connection between the battery racks 100-1, 100-2, 100-3, 100-4, 100-5, and 100-6 and the grid 200. That is, if the rack BMS 130-2 detects the ground fault, the master BMS 400 prevents the current from flowing further through the chassis by disconnecting all connections between the battery racks 100-1, 100-2, 100-3, 100-4, 100-5, and 100-6 and the grid 200, thereby protecting the battery rack 100 and ensuring safety of a person using the battery rack 100.

Hereinabove, although it is described that only the rack BMS 130-2 among the plurality of rack BMSs 130-1, 130-2, 130-3, 130-4, 130-5, and 130-6 detects the ground fault, it is necessary to prepare for a case in which the rack BMS 130-2 may not detect the ground fault. Here, the case in which the rack BMS 130-2 may not detect the ground fault may correspond to a case in which a connection between the battery rack 100-2 and the grid 200 is disconnected before the rack BMS 130-2 detects the ground fault.

One of the cases in which the connection between the battery rack 100-2 and the grid 200 is disconnected is a case in which the rack BMS 130-2 disconnects the connection between the battery rack 100-2 and the grid 200 due to problems such as too high temperature of the battery rack 100-2 or a high voltage applied to the battery rack 100-2. In addition, in this case, since the battery rack 100-2 is not connected to the grid 200, the rack BMS 130-2 may not detect the ground fault, and thus may not generate the information on the ground fault.

When the rack BMS 130-2 disconnects the connection between the battery rack 100-2 and the grid 200, the rack BMS 130-2 transmits an information generation disable signal to the master BMS 400 through communication. In addition, when the master BMS 400 receives the information generation disable signal from the rack BMS 130-2, the ground fault detection command signal for detecting the ground fault may be transmitted to the rack BMS 130-3 included in the battery rack (e.g., 100-3 in FIG. 4) other than the battery rack 100-2 disconnected from the grid 200 according to a predetermined algorithm in the master BMS 400. Thereafter, the rack BMS 130-3 that receives the ground fault detection command signal from the master BMS 400 performs a function of detecting the ground fault, generating the information on the ground fault, and outputting the generated information on the ground fault to the master BMS 400 instead of the rack BMS 130-2.

When the rack BMS 130-3 disconnects the connection between the battery rack 100-3 and the grid 200, the rack BMS 130-3 transmits an information generation disable signal to the master BMS 400 through communication. In addition, when the master BMS 400 receives the information generation disable signal from the rack BMS 130-3, the ground fault detection command signal may be transmitted to the rack BMS 130-4 included in the battery rack (e.g., 100-4 in FIG. 4) according to a predetermined algorithm in the master BMS 400. Thereafter, the rack BMS 130-4 that receives the ground fault detection command signal from the master BMS 400 performs a function of detecting the ground fault, generating the information on the ground fault, and outputting the generated information on the ground fault to the master BMS 400 instead of the rack BMS 130-3.

The other of the cases in which the connection between the battery rack 100-2 and the grid 200 is disconnected is a case in which the master BMS 400 transmits a forced dropping command signal to the rack BMS 130-2 included in the battery rack 100-2.

Specifically, when a voltage imbalance occurs in any one 100-2 among the plurality of battery racks 100-1, 100-2, 100-3, 100-4, 100-5, and 100-6 (FIG. 4 illustrates a state in which the voltage imbalance occurs in the battery rack 100-2 because a voltage charged in the battery tray 120-2 of the battery rack 100-2 is lower than a voltage charged in other battery trays 120-1, 120-3, 120-4, and 120-5), the master BMS 400 may disconnect the battery rack 100-2 in which the voltage imbalance occurs from the grid 200 to allow the battery rack 100-2 to perform voltage balancing by itself, and again connect the battery rack 100-2 to the grid 200 during the voltage balancing or after the voltage balancing is completed. As such, in order for the battery rack 100-2 in which the voltage imbalance occurs to perform the voltage balancing by itself, a process of forcibly dropping the battery rack 100-2 from the grid 200 needs to be preceded, and accordingly, the master BMS 400 transmits the forced dropping command signal to the rack BMS 130-2 included in the battery rack 100-2.

When the rack BMS 130-2 receives the forced dropping command signal from the master BMS 400, the rack BMS 130-2 turns off the relay 300 and forcibly drops the battery rack 100-2 from the grid 200. In addition, in this case, since the battery rack 100-2 is not connected to the grid 200, the rack BMS 130-2 may not detect the ground fault, and thus may not generate the information on the ground fault.

As such, when the master BMS 400 transmits the forced dropping command signal to the rack BMS 130-2 included in the battery rack 100-2 to forcibly drop the battery rack 100-2 from the grid 200, the master BMS 400 may transmit a ground fault detection command signal for detecting the ground fault to the rack BMS 130-3 included in the battery rack (e.g., 100-3 in FIG. 4) other than the battery rack 100-2 disconnected with the grid 200 according to a predetermined algorithm. Thereafter, the rack BMS 130-3 that receives the ground fault detection command signal from the master BMS 400 performs a function of detecting the ground fault, generating the information on the ground fault, and outputting the generated information on the ground fault to the master BMS 400 instead of the rack BMS 130-2.

Thereafter, when the master BMS 400 transmits the forced dropping command signal to the rack BMS 130-3 included in the battery rack 100-3, the rack BMS 130-3 turns off the relay 300 and forcibly drops the battery rack 100-3 from the grid 200. In addition, in this case, since the battery rack 100-3 is not connected to the grid 200, the rack BMS 130-3 may not detect the ground fault and may not generate the information on the ground fault, and therefore, the master BMS 400 may transmit the ground fault detection command signal to the rack BMS 130-4 included in the battery rack (e.g., 100-4 in FIG. 4) according to a predetermined algorithm. Thereafter, the rack BMS 130-4 that receives the ground fault detection command signal from the master BMS 400 performs a function of detecting the ground fault, generating the information on the ground fault, and outputting the generated information on the ground fault to the master BMS 400 instead of the rack BMS 130-3.

As such, the rack BMS 130-2 performing the function of detecting the ground fault and generating the information on the ground fault is set, and the algorithm for enabling the function of detecting the ground fault and generating the information on the ground fault to be performed in the other rack BMSs (130-3→130-4→130-5→130-6) is provided to the master BMS 400 in case that the rack BMS 130-2 does not generate the information on the ground fault, thereby making it possible to improve accuracy and stability of the ground fault detection.

FIG. 6 is a flowchart of a control method for detecting a ground fault according to the present invention and illustrates the control method performed through the control system for detecting the ground fault described above.

In the control method for detecting the ground fault illustrated in FIG. 6, first, the rack BMS 130-2 included in any one (100-2 in FIG. 4) of the plurality of battery racks 100-1, 100-2, 100-3, 100-4, 100-5, and 100-6 which are connected in parallel to the grid 200 through the relay 300 detects the ground fault through the circuit embedded therein, generates the information on the ground fault, and outputs the generated information on the ground fault to the master BMS 400 (S100).

Next, the master BMS 400 receives the information on the ground fault from the rack BMS 130-2 included in any one battery rack 100-2, generates a grid disconnection command signal, and transmits the grid disconnection command signal to the rack BMSs 130-1, 130-2, 130-3, 130-4, 130-5, and 130-6 included in the battery racks 100-1, 100-2, 100-3, 100-4, 100-5, and 100-6 (S200).

Next, the rack BMSs 130-1, 130-2, 130-3, 130-4, 130-5, and 130-6 included in the battery racks 100-1, 100-2, 100-3, 100-4, 100-5, and 100-6 turn off the relay 300 according to the grid disconnection command signal received from the master BMS 400 and disconnect the connections between the battery racks 130-1, 130-2, 130-3, 130-4, 130-5, and 130-6 and the grid 200.

As such, according to the control method described with reference to FIG. 6, if the rack BMS 130-2 detects the ground fault, all the connections between the battery racks 100-1, 100-2, 100-3, 100-4, 100-5, and 100-6 and the grid 200 are disconnected and the current does not flow through the chassis, thereby protecting the battery rack 100 and ensuring safety of a person using the battery rack 100.

However, in a case in which the connection between the battery rack 100-2 and the grid 200 is disconnected before the rack BMS 130-2 detects the ground fault, since the rack BMS 130-2 may not detect the ground fault, it needs to be prepared.

A case in which the rack BMS 130-2 may not detect the ground fault is a case in which the rack BMS 130-2 disconnects the connection between the battery rack 100-2 and the grid 200 problems such as an excessively high temperature of the battery rack 100-2 or a high voltage applied to the battery rack 100-2. In this case, since the battery rack 100-2 is not connected to the grid 200, the rack BMS 130-2 may not detect the ground fault, and thus may not generate the information on the ground fault.

In this case, the rack BMS 130-2 transmits the information generation disable signal to the master BMS 400 through communication, and when the master BMS 400 receives the information generation disable signal, the ground fault detection command signal for detecting the ground fault may be transmitted to the rack BMS 130-3 included in the battery rack (e.g., 100-3 in FIG. 4) other than the battery rack 100-2 disconnected from the grid 200 according to a predetermined algorithm in the master BMS 400. Thereafter, the rack BMS 130-3 that receives the ground fault detection command signal from the master BMS 400 performs a function of detecting the ground fault, generating the information on the ground fault, and outputting the generated information on the ground fault to the master BMS 400 instead of the rack BMS 130-2.

The other case in which the rack BMS 130-2 may not detect the ground fault is a case in which the master BMS 400 transmits the forced dropping command signal to the rack BMS 130-2 included in the battery rack 100-2.

Specifically, when a voltage imbalance occurs in any one 100-2 among the plurality of battery racks 100-1, 100-2, 100-3, 100-4, 100-5, and 100-6, the master BMS 400 may disconnect the battery rack 100-2 in which the voltage imbalance occurs from the grid 200 to allow the battery rack 100-2 to perform voltage balancing by itself, and again connect the battery rack 100-2 to the grid 200 during the voltage balancing or after the voltage balancing is completed. As such, in order for the battery rack 100-2 in which the voltage imbalance occurs to perform the voltage balancing by itself, a process of forcibly dropping the battery rack 100-2 from the grid 200 needs to be preceded, and accordingly, the master BMS 400 transmits the forced dropping command signal to the rack BMS 130-2 included in the battery rack 100-2.

When the rack BMS 130-2 receives the forced dropping command signal from the master BMS 400, the rack BMS 130-2 turns off the relay 300 and forcibly drops the battery rack 100-2 from the grid 200. In addition, in this case, since the battery rack 100-2 is not connected to the grid 200, the rack BMS 130-2 may not detect the ground fault, and thus may not generate the information on the ground fault.

As such, when the master BMS 400 transmits the forced dropping command signal to the rack BMS 130-2 included in the battery rack 100-2 to forcibly drop the battery rack 100-2 from the grid 200, the master BMS 400 may transmit a ground fault detection command signal for detecting the ground fault to the rack BMS 130-3 included in the battery rack (e.g., 100-3 in FIG. 4) other than the battery rack 100-2 disconnected with the grid 200 according to a predetermined algorithm. Thereafter, the rack BMS 130-3 that receives the ground fault detection command signal from the master BMS 400 performs a function of detecting the ground fault, generating the information on the ground fault, and outputting the generated information on the ground fault to the master BMS 400 instead of the rack BMS 130-2.

As such, the rack BMS 130-2 performing the function of detecting the ground fault and generating the information on the ground fault is set, and the algorithm for enabling the function of detecting the ground fault and generating the information on the ground fault to be performed in the other rack BMSs (130-3→130-4→130-5→130-6) is provided to the master BMS 400 in case that the rack BMS 130-2 does not generate the information on the ground fault, thereby making it possible to improve accuracy and stability of the ground fault detection. According to the present invention, the rack BMS detects the ground fault through the circuit embedded therein, and as the master BMS is configured to disconnect all the connections between the battery racks and the grid in the case in which the rack BMS detects the ground fault, no more current flows through the chassis, thereby protecting the battery racks and ensuring the safety of the person using the battery racks.

In addition, according to the present invention, the rack BMS performing the function of detecting the ground fault and generating the information on the ground fault is set, and the algorithm for enabling the function of detecting the ground fault and generating the information on the ground fault to be performed in the other rack BMSs is provided to the master BMS in case that the rack BMS does not generate the information on the ground fault, thereby making it possible to improve accuracy and stability of the ground fault detection.

Although the present invention has been described with reference to the exemplary embodiments and the accompanying drawings, it is not limited to the above-mentioned exemplary embodiments but may be variously modified and changed from the above description by those skilled in the art to which the present invention pertains. Therefore, the spirit of the present invention should be understood only by the claims, and all of the equivalences and equivalent modifications to the claims are intended to fall within the scope and spirit of the present invention.

DETAILED DESCRIPTION OF MAIN ELEMENTS

100 (100-1, 100-2, 100-3, 100-4, 100-5, 100-6): battery rack
120 (120-1, 120-2, 120-3, 120-4, 120-5): battery tray
125: battery cell
130 (130-1, 130-2, 130-3, 130-4, 130-5, 130-6): rack BMS
132: main MCU
134: rack voltage and current measurement MCU
136: ground fault detection MCU
140 (140-1, 140-2, 140-3, 140-4, 140-5, 140-6): chassis
200: grid
300: relay
400: master BMS

What is claimed is:

1. A control system for detecting a ground fault, the control system comprising:
    a plurality of rack battery management systems (BMSs), each of them included in each of a plurality of battery racks which are connected in parallel to a grid through a relay, and embedded with a circuit for detecting the ground fault and generating information on the ground fault; and
    a master BMS that generates a grid disconnection command signal by receiving the information on the ground fault from any one of the plurality of rack BMSs,
    wherein the detection of the ground fault and the generation of the information on the ground fault are set to be performed only in any one of the plurality of rack BMSs, and
    when the master BMS receives the information on the ground fault from the any one rack BMS, the master BMS generates a grid disconnection command signal and transmits the grid disconnection command signal to all the rack BMSs, respectively, and
    the rack BMS included in each battery rack turns off the relay according to the grid disconnection command signal received from the master BMS so that a connection between all the battery racks and the grid is disconnected, and
    wherein an algorithm is provided in the master BMS to enable another rack BMS to detect the ground fault and generate the information on the ground fault when the any one rack BMS does not generate the information on the ground fault.

2. The control system of claim 1, wherein when the any one rack BMS does not generate the information on the ground fault, an information generation disable signal is transmitted to the master BMS, and
    when the master BMS receives the information generation disable signal, a ground fault detection command signal for detecting the ground fault is transmitted to the rack BMS other than the any one rack BMS according to the algorithm.

3. The control system of claim 1, wherein when the master BMS transmits a forced dropping command signal to the any one rack BMS and a battery rack including the any one rack BMS is forcibly dropped from the grid, a ground fault detection command signal for detecting the ground fault is transmitted to the rack BMS other than the any one rack BMS according to the algorithm.

4. The control system of claim 1, wherein the circuit is embedded in a micro controller unit (MCU) separate from a main MCU of the rack BMS, and a voltage and current measurement MCU of the battery rack.

5. A control method for detecting a ground fault, the control method comprising:
    any one of a plurality of rack battery management systems (BMSs), each of them included in each of a plurality of battery racks which are connected in parallel to a grid through a relay detecting the ground fault and generating information on the ground fault through a circuit embedded in the rack BMS;
    a master BMS generating a grid disconnection command signal by receiving the information on the ground fault from the any one rack BMS and transmitting the grid disconnection command signal to all the rack BMSs, respectively; and
    the rack BMS included in each battery rack turning off the relay according to the grid disconnection command signal received from the master BMS so that a connection between all the battery racks and the grid is disconnected, wherein the detection of the ground fault and the generation of the information on the ground fault are set to be performed only in the any one rack BMS, and an algorithm is provided in the master BMS to enable another rack BMS to detect the ground fault and generate the information on the ground fault when the any one rack BMS does not generate the information on the ground fault.

6. The control method of claim 5, wherein when the any one rack BMS does not generate the information on the ground fault, an information generation disable signal is transmitted to the master BMS, and when the master BMS receives the information generation disable signal, a ground fault detection command signal for detecting the ground fault is transmitted to the rack BMS other than the any one rack BMS according to the algorithm.

7. The control method of claim 5, wherein when the master BMS transmits a forced dropping command signal to the any one rack BMS and a battery rack including the any one rack BMS is forcibly dropped from the grid, a ground fault detection command signal for detecting the ground fault is transmitted to the rack BMS other than the any one rack BMS according to the algorithm.

8. The control method of claim 5, wherein the circuit is embedded in a micro controller unit (MCU) separate from a main MCU of the rack BMS, and a voltage and current measurement MCU of the battery rack.

\* \* \* \* \*